(12) United States Patent
Hotta et al.

(10) Patent No.: US 9,472,454 B2
(45) Date of Patent: Oct. 18, 2016

(54) TUNGSTEN FILM FORMING METHOD

(71) Applicant: TOKYO ELECTRON LIMITED, Tokyo (JP)

(72) Inventors: Takanobu Hotta, Nirasaki (JP); Yasushi Aiba, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/668,564

(22) Filed: Mar. 25, 2015

(65) Prior Publication Data
US 2015/0279736 A1    Oct. 1, 2015

(30) Foreign Application Priority Data
Mar. 28, 2014   (JP) ................................. 2014-069008

(51) Int. Cl.
    *H01L 21/44*      (2006.01)
    *H01L 21/768*     (2006.01)
    *H01L 23/532*     (2006.01)

(52) U.S. Cl.
    CPC ... *H01L 21/76883* (2013.01); *H01L 21/76879* (2013.01); *H01L 23/53257* (2013.01); *H01L 2924/0002* (2013.01)

(58) Field of Classification Search
    CPC ............. H01L 21/44; H01L 21/76879; H01L 21/76883; H01L 23/53257
    USPC ........................................................ 438/660
    See application file for complete search history.

(56) References Cited

U.S. PATENT DOCUMENTS

| | | | | |
|---|---|---|---|---|
| 6,287,964 | B1 * | 9/2001 | Cho | H01L 21/76877 257/763 |
| 2007/0009658 | A1 * | 1/2007 | Yoo | C23C 16/14 427/248.1 |
| 2010/0144140 | A1 | 6/2010 | Chandrashekar et al. | |
| 2010/0240212 | A1 * | 9/2010 | Takahashi | H01L 21/76877 438/637 |
| 2011/0159690 | A1 * | 6/2011 | Chandrashekar | H01L 21/28556 438/675 |
| 2013/0307032 | A1 * | 11/2013 | Kamineni | H01L 23/485 257/288 |
| 2015/0050807 | A1 * | 2/2015 | Wu | H01L 21/28556 438/669 |

FOREIGN PATENT DOCUMENTS

| | | |
|---|---|---|
| JP | 2002-009017 | 1/2002 |
| JP | 2010-153852 | 7/2010 |
| JP | 2010-225697 | 10/2010 |
| JP | 2013-032575 | 2/2013 |
| KR | 10-0165356 B1 | 12/1998 |

\* cited by examiner

*Primary Examiner* — Phuc Dang

(57) ABSTRACT

In a tungsten film forming method, a substrate having a recess is provided in a processing chamber, and a first tungsten film is formed on the substrate to fill the recess with a tungsten by simultaneously or alternately supplying $WCl_6$ gas as a tungsten source and a reducing gas under a depressurized atmosphere of the processing chamber, and by reacting the $WCl_6$ gas with the reducing gas while heating the substrate. Then, an opening is formed in the tungsten filled in the recess by supplying $WCl_6$ gas into the processing chamber and etching an upper portion of the tungsten. Thereafter, a second tungsten film is formed on the substrate having the opening by simultaneously or alternately supplying the $WCl_6$ gas and the reducing gas into the processing chamber, and by reacting the $WCl_6$ gas with the reducing gas while heating the substrate.

10 Claims, 7 Drawing Sheets

TUNGSTEN FILM FORMING METHOD

CROSS-REFERENCE TO RELATED APPLICATIONS

This application claims priority to Japanese Patent Application No. 2014-069008 filed on Mar. 28, 2014, the entire contents of which are incorporated herein by reference.

FIELD OF THE INVENTION

The present invention relates to a tungsten film forming method for filling a tungsten film in a hole formed on a substrate.

BACKGROUND OF THE INVENTION

In a semiconductor device manufacturing process, a tungsten film is used for filling a recess (via hole) between wirings or a substrate contact recess (contact hole) formed at a semiconductor wafer (hereinafter, simply referred to as "wafer") that is an object to be processed.

As for a tungsten film forming method, a physical vapor deposition (PVD) method has been conventionally used. However, tungsten W is a high melting point metal and it is difficult in PVD method to deal with a high coverage required along with a recent trend toward miniaturization of devices. Therefore, a chemical vapor deposition (CVD) method capable of dealing with a high coverage and the miniaturization of devices is recently widely used instead of the PVD method. As for the tungsten film forming method using CVD, there is conventionally known a method for allowing reaction between tungsten hexafluoride ($WF_6$) as a source gas and $H_2$ gas as a reducing gas on a wafer, which is expressed by a reaction scheme $WF_6 + 3H_2 \rightarrow W + 6HF$. In this case, even a fine hole can be filled with a film with a step coverage of about 100%.

However, along with a recent trend toward a high aspect ratio of a hole, a central portion of the hole may be swollen due to bowing. In this case, even if the step coverage of 100% is ensured, a void or a seam is generated at the central portion of a buried tungsten film. The generated void or seam is exposed by CMP (chemical mechanical planarization) after the film formation, which inflicts adverse effect on semiconductor performance.

As for a technique capable of solving the above problems, there is known a technique in which after a tungsten film is buried, an upper portion of the tungsten film is etched by a plasma of $NF_3$ gas, and then a film is formed to fill a seam in the tungsten film (see Japanese Patent Application Publication No. 2010-153852).

There is also known a technique in which after tungsten W is buried by using $H_2$ gas and $WF_6$ as a film forming gas, a through hole is formed by etching a part of the buried tungsten by using, as an etching gas, $WF_6$ whose flow rate is changed, and then a cavity is filled by forming a tungsten film (see Japanese Patent Application Publication No. 2010-225697).

Further, there is known a technique in which a hole is filled with tungsten W, without generating an overhang, by alternately performing a process of forming a tungsten (W) film in a hole and an etching process using $ClF_3$ gas (see Japanese Patent Application Publication No. 2002-9017).

Furthermore, there is known a technique in which a tungsten film is formed to form a tungsten buried portion in a hole by a CVD method by using $WF_6$ gas and $H_2$ gas, and an opening is formed by etching an upper portion of the buried portion by supplying, as an etching gas, $ClF_3$ gas or $F_2$ gas into a processing chamber that is the same as that used for the film formation, and then tungsten is buried in a void or a seam by forming a tungsten film again by the CVD method in the same processing chamber (see Japanese Patent Application Publication No. 2013-32575).

However, the technique disclosed in Japanese Patent Application Publication No. 2010-153852 is disadvantageous in that the processing is complicated and a throughput is decreased, because a plasma is used for the etching process and a chamber for film formation and a chamber for etching need to be separately provided.

In the technique disclosed in Japanese Patent Application Publication No. 2010-225697, $WF_6$ gas used as a film forming gas is also used as an etching gas, and the etching and the film formation are switched by changing a flow rate of the $WF_6$ gas. However, it is disadvantageous in that the etching property of the $WF_6$ gas is insufficient to make it difficult to reliably perform the etching. Further, such a technique is not enough to deal with miniaturization of devices, because fluorine contained in $WF_6$ inflicts damage to a base film when barrier metal becomes thin along with the miniaturization of devices.

The technique disclosed in Japanese Patent Application Publication No. 2002-9017 prevents generation of a void due to connection of overhang portions by repeating an operation of planarizing a film by performing an etching process when an overhang portion is generated during film formation. Thus, it is disadvantageous in that the processing is complicated and it is difficult to control the processing. Further, etching conditions or the like are not specifically disclosed therein.

The technique disclosed in Japanese Patent Application Publication No. 2013-32575 can solve the problems of the Japanese Patent Application Publication Nos. 2013-32575, 2002-9017 and 2010-225697. However, the technique disclosed in Japanese Patent Application Publication No. 2013-32575 is disadvantageous in that a throughput is decreased in the case of performing the film formation and the etching in the same processing chamber, because a temperature suitable for formation of a tungsten film and a temperature suitable for etching are different.

SUMMARY OF THE INVENTION

In view of the above, the present invention provides a tungsten film forming method capable of simply forming a tungsten film at a high throughput without inflicting an adverse effect on a base due to the miniaturization and capable of eliminating a void or a seam formed at a buried portion.

The present inventors have repeated examinations for solving the above problems and have considered that a tungsten film can be formed by using, as a tungsten source material, $WCl_6$ gas instead of conventional $WF_6$ gas, and further, $WCl_6$ gas has an etching property. In this respect, the present inventors have discovered that the process of filing tungsten in a fine recess, the process of forming an opening in the buried portion by etching, and the process of filling a void or a seam can be performed in the same processing chamber by using the $WCl_6$ gas.

In accordance with a first aspect of the present invention, there is provided a tungsten film forming method including: providing a substrate having a recess in a processing chamber; forming a first tungsten film on the substrate to fill the recess with a tungsten by simultaneously or alternately supplying $WCl_6$ gas as a tungsten source and a reducing gas under a depressurized atmosphere of the processing chamber, and by reacting the $WCl_6$ gas with the reducing gas while heating the substrate; forming an opening in the tungsten filled in the recess by supplying $WCl_6$ gas into the processing chamber and etching an upper portion of the tungsten; and forming a second tungsten film on the substrate having the opening by simultaneously or alternately supplying the $WCl_6$ gas and the reducing gas into the processing chamber, and by reacting the $WCl_6$ gas with the reducing gas while heating the substrate.

In accordance with a second aspect of the present invention, there is provided a tungsten film forming method including: providing a substrate having a recess in a processing chamber; forming a first tungsten film on the substrate to fill the recess with a tungsten of the first tungsten film by simultaneously or alternately supplying $WCl_6$ gas as a tungsten source and a reducing gas under a depressurized atmosphere of the processing chamber, and by reacting the $WCl_6$ gas with the reducing gas while heating the substrate so that a cavity having an opening is formed at an upper portion of the tungsten filled in the recess by an etching reaction of the $WCl_6$ gas; and forming a second tungsten film on the substrate having the tungsten filled in the recess by simultaneously or alternately supplying the $WCl_6$ gas and the reducing gas into the processing chamber, and by reacting the $WCl_6$ gas with the reducing gas while heating the substrate so that the cavity is filled with a tungsten of the second tungsten film.

In accordance with a third aspect of the present invention, there is provided a non-transitory computer-executable storage medium including computer executable instructions, when executed by a processor, causing the processor to perform any one of the tungsten film forming methods described above.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with respect to the accompanying drawings.

<Film Forming Apparatus>

Figure 1:
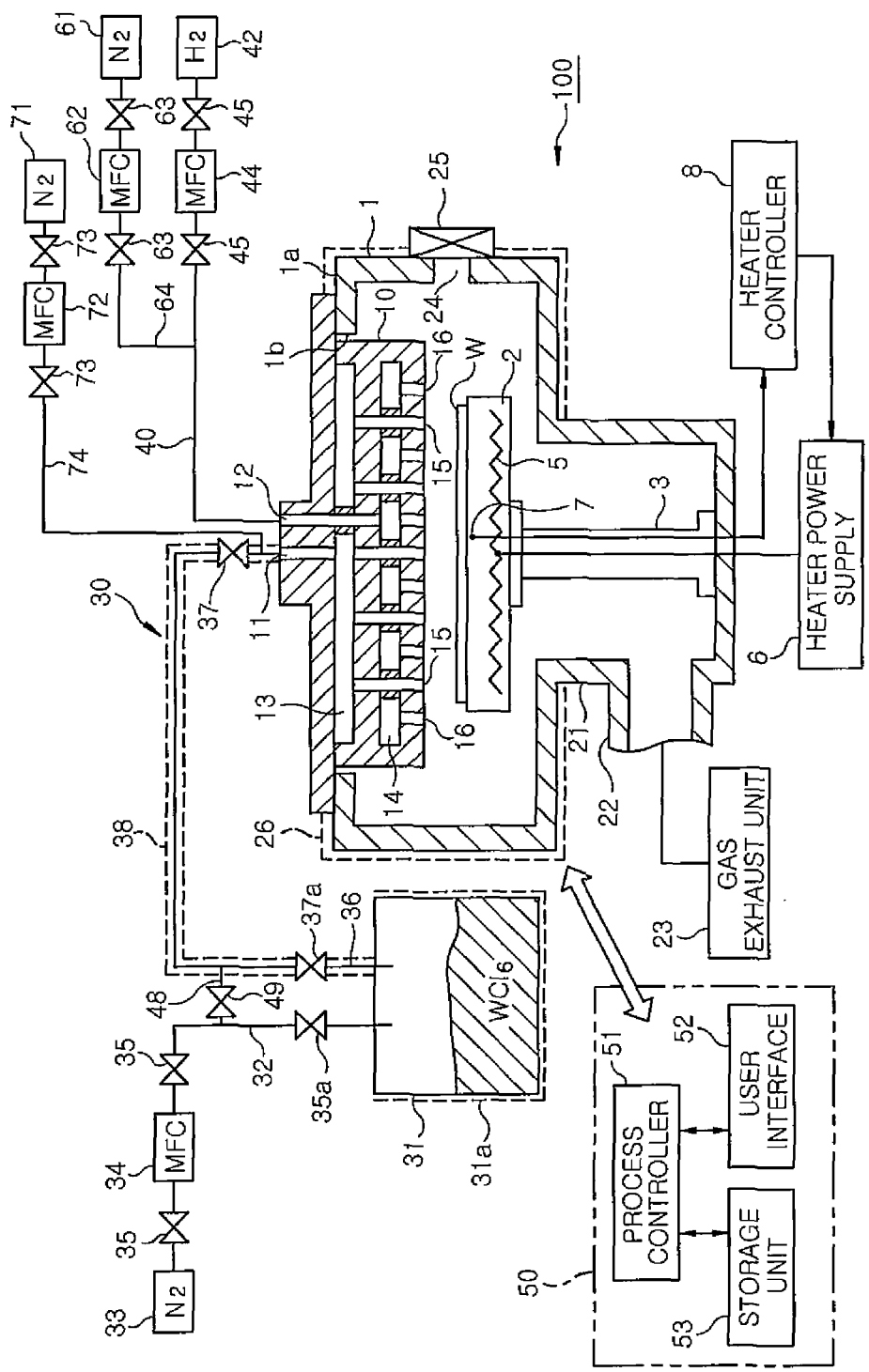
FIG. 1 is a cross sectional view showing an example of a film forming apparatus for implementing a tungsten film forming method in accordance with an embodiment of the present invention.

FIG. 1 is a cross sectional view showing an example of a film forming apparatus for implementing a tungsten film forming method in accordance with an embodiment of the present invention.

As shown in FIG. 1, a film forming apparatus 100 includes an airtight cylindrical chamber 1. In the chamber 1, a susceptor 2 for horizontally supporting a wafer W serving as a substrate to be processed is supported by a cylindrical supporting member 3 extending from a bottom portion of a gas exhaust chamber, which will be described later, to a lower central portion of the chamber 1. The susceptor 2 is made of ceramic, e.g., AlN or the like. A heater 5 is embeded in the susceptor 2. A heater power supply 6 is connected to the heater 5. A thermocouple 7 is provided near a top surface of the susceptor 2. A signal of the thermocouple 7 is transmitted to a heater controller 8. The heater controller 8 transmits an instruction to the heater power supply 6 based on the signal of the thermocouple 7 and controls a wafer W to a predetermined temperature by controlling the heating of the heater 5. Three wafer elevation pins (not shown) are provided at the susceptor 2 so as to protrude and retract from the top surface of the susceptor 2. When the wafer W is transferred, the elevation pins protrude from the surface of the susceptor 2. The susceptor 2 is vertically movable by an elevation unit (not shown).

A circular hole 1b is formed at a ceiling wall 1a of the chamber 1. A shower head 10 is inserted into the chamber 1 through the hole 1b so as to protrude inside the chamber 1. The shower head 10 injects into the chamber 1 $WCl_6$ gas serving as a film forming source gas supplied from a gas supply unit 30 to be described later. A first introduction line 11 for introducing $WCl_6$ gas and $N_2$ gas as a purge gas and a second introduction line 12 for introducing $H_2$ gas as a reducing gas and $N_2$ gas as a purge gas are provided at an upper portion of the shower head 10.

Inside the shower head 10, there are provided an upper space 13 and a lower space 14. The first introduction line is connected to the upper space 13. A first gas injection line 15 extends from the space 13 to a bottom surface of the shower head 10. The second introduction line 12 is connected to the lower space 14. A second gas injection line 16 extends from the lower space 14 to the bottom surface of the shower head 10. In other words, the shower head 10 is configured to independently inject $WCl_6$ gas as a film forming source gas and $H_2$ gas as a reducing gas from the injection lines 15 and 16.

A gas exhaust chamber 21 protruding downward is provided at a bottom wall of the chamber 1. A gas exhaust line 22 is connected to a side surface of the gas exhaust chamber 21. A gas exhaust unit 23 including a vacuum pump, a pressure control valve and the like is connected to the gas exhaust line 22. By operating the gas exhaust unit 23, a pressure in the chamber 1 can be set to a predetermined vacuum level.

A loading/unloading port 24 for loading/unloading a wafer and a gate valve 25 for opening/closing the loading/unloading port 24 are provided at a sidewall of the chamber 1. A heater 26 is provided at a wall of the chamber 1, so that a temperature of an inner wall of the chamber 1 can be controlled during the formation of a film.

The gas supply unit 30 includes a film forming material tank 31 which accommodates $WCl_6$ as a source material for film formation. $WCl_6$ exists in a solid state at a room temperature and thus is accommodated in a solid state in the film forming material tank 31. A heater 31a is provided around the film forming material tank 31. The film forming source material, $WCl_6$, in the tank 31 is heated to a proper temperature and sublimated.

A carrier gas line 32 for supplying $N_2$ gas as a carrier gas is inserted into the film forming material tank 31 through the top thereof. The carrier gas line 32 is connected to a $N_2$ gas supply source 33. A mass flow controller 34 which is a flow rate controller and valves 35 disposed at an upstream side and a downstream side thereof are provided at the carrier gas line 32. One end of a source gas delivery line 36 is inserted into the film forming material tank 31 through the top thereof. The other end of the source gas delivery line 36 is connected to the first introduction line 11 of the shower head 10. A valve 37 is disposed at the source gas delivery line 36. A heater 38 for preventing condensation of $WCl_6$ gas serving as a film forming source gas is provided around the source gas delivery line 36. $WCl_6$ gas sublimated in the film forming material tank 31 is transferred by $N_2$ gas as a carrier gas and supplied into the shower head 10 through the source gas delivery line 36 and the first introduction line 11. The source gas delivery line 36 is also connected to a $N_2$ gas supply source 71 via a bypass line 74. A mass flow controller 72 which is a flow rate controller and valves 73 disposed at an upstream side and a downstream side thereof are provided at the bypass line 74. The $N_2$ gas from the $N_2$ gas supply source 71 is used as a purge gas supplied through the first introduction line 11.

The carrier gas line 32 and the source gas delivery line 36 are connected by a bypass line 48. A valve 49 is provided at the bypass line 48. Valves 35a and 37a are respectively provided at the carrier gas line 32 and the source gas delivery line 36 at a downstream side of the connecting portion of the bypass line 48. By closing the valves 35a and 37a and opening the valve 49, $N_2$ gas from the $N_2$ gas supply source 33 can be supplied through the carrier gas line 32 and the bypass line 48 to the source gas delivery line 36 to purge the source gas delivery line 36. The carrier gas and the purge gas are not limited to $N_2$ gas and may be another inert gas such as Ar gas or the like.

A line 40 serving as a $H_2$ gas line is connected to the second introduction line 12 of the shower head 10. The line 40 is connected to a $H_2$ gas supply source 42 for supplying $H_2$ gas as a reducing gas. The line 40 is also connected to a $N_2$ gas supply source 61 via a bypass line 64. A mass flow controller 44 which is a flow rate controller and valves 45 disposed at an upstream side and a downstream side thereof are provided at the line 40. A mass flow controller 62 which is a flow rate controller and valves 63 disposed at an upstream side and a downstream side thereof are provided at the bypass line 64. The $N_2$ gas from the $N_2$ gas supply source is used as a purge gas supplied through the second introduction line 12. The reducing gas is not limited to $H_2$ gas and may be $SiH_4$ gas, $B_2H_6$ gas, or the like. Two or more of $H_2$ gas, $SiH_4$ gas and $B_2H_6$ gas may be supplied. Further, a reducing gas other than those gases may be used.

The film forming apparatus 100 includes a control unit 50 for controlling the respective components, specifically the valves, the power supply, the heaters, the pump and the like. The control unit 50 includes a process controller 51 having a microprocessor (computer), a user interface 52, and a storage unit 53. The respective components of the film forming apparatus 100 are electrically connected to the process controller 51 and controlled by the process controller 51. The user interface 52 is connected to the process controller 51. The user interface 52 includes a keyboard through which an operator inputs a command or the like to manage the respective components of the film forming apparatus 100, a display for visually displaying an operation state of the respective components of the film forming apparatus 100, and so forth. The storage unit 53 is connected to the process controller 51. The storage unit 53 stores a control program for realizing various processes performed by the film forming apparatus 100 under the control of the process controller 51, a control program, i.e., a processing recipe, for controlling the respective components of the film forming apparatus 100 to perform predetermined processes based on the processing conditions, various database and the like. The processing recipe is stored in a storage medium (not shown) in the storage unit 53. The storage medium may be a fixed medium such as a hard disk or the like, or may be a portable medium such as a CDROM, a DVD, a flash memory or the like. Alternatively, the processing recipe may be appropriately transmitted from another device through, e.g., a dedicated line.

If necessary, a predetermined processing recipe is retrieved from the storage unit 53 by an instruction from the user interface 52 or the like and executed by the process controller 51. Accordingly, a desired process is performed in the film forming apparatus 100 under the control of the process controller 51.

<Film Forming Method of First Embodiment>

Figure 2:
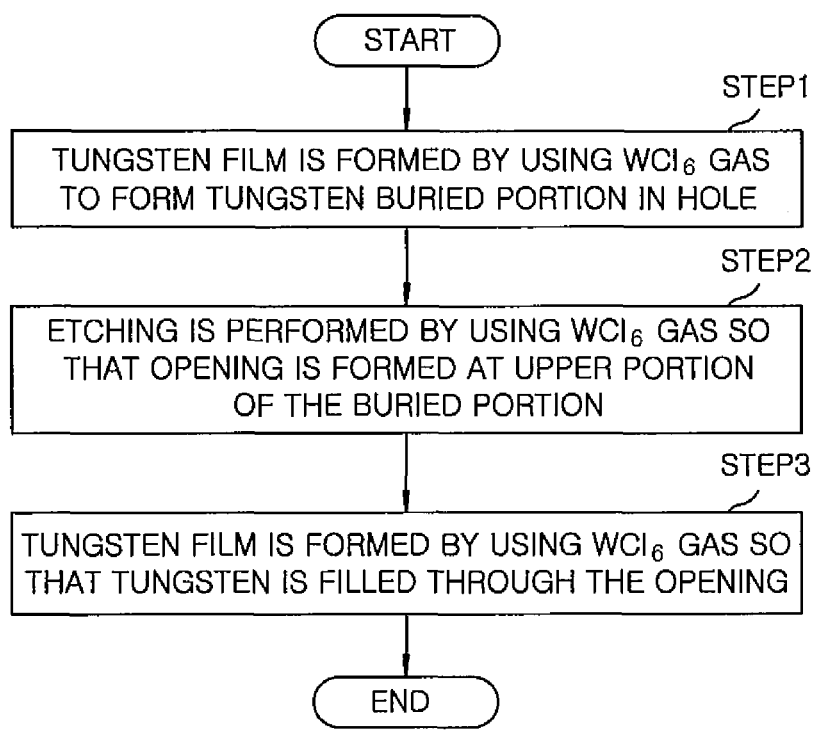
FIG. 2 is a flowchart of the film forming method in accordance with a first embodiment of the present invention.
Figure 3A:
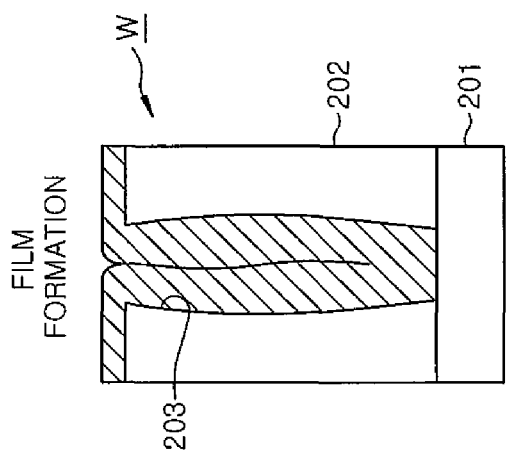
FIGS. 3A to 3C are cross sectional views showing processes of the film forming method in accordance with the first embodiment of the present invention.
Figure 3B:
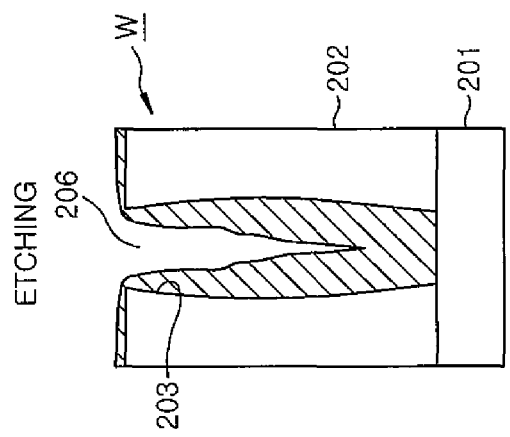
Figure 3C:
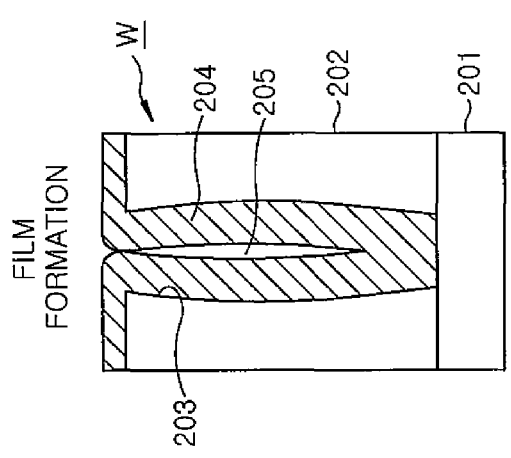

Hereinafter, a film forming method in accordance with a first embodiment of the present invention which is performed by the film forming apparatus 100 configured as described above will be described. FIG. 2 is a flowchart of the film forming method in accordance with the first embodiment of the present invention. FIGS. 3A to 3C are cross sectional views showing processes of the film forming method.

First, a wafer W in which an interlayer insulating layer 202 is formed on a semiconductor substrate or a base 201 as an underlying conductive layer and a hole (contact hole or via hole) 203 as a recess is formed in the interlayer insulating layer 202 is mounted on a susceptor 2 in the chamber 1. A tungsten film is formed on the wafer W by a CVD (chemical vapor deposition) or an ALD (atomic layer deposition) by using $WCl_6$ gas as a tungsten source gas and $H_2$ gas as a reducing gas, thereby forming a tungsten buried portion 204 which fills the hole 203 (step 1, see FIG. 3A). As for the reducing gas, it is possible to use $SiH_4$ gas, $B_2H_6$ gas or the like, other than $H_2$ gas, and in this case, film formation can be performed under the same condition as the case of using $H_2$ gas. In view of realization of a low resistivity by reducing impurities in the film, it is preferable to use $H_2$ gas. Further, it is preferable to form a metal barrier film, e.g., a TiN film, in the hole 203.

$WF_6$ gas was conventionally used as a tungsten source material. However, the present inventors have found, as a result of examination, that a tungsten film can also be formed by using $WCl_6$ gas. The $WCl_6$ gas has an etching property. The $WCl_6$ gas was conventionally considered to be unsuitable for film formation, since a film may not be formed under the film forming conditions suitable for $WF_6$ gas. However, it has been found that a tungsten film can be formed without etching by appropriately setting the conditions. In basic film forming conditions, it is preferable to set a film forming temperature to 400° C. or above and a pressure to 10 Torr (about 1333 Pa) or above. This is because the film forming reaction hardly occurs at a temperature lower than 400° C. and the etching reaction easily occurs at a pressure lower than 10 Torr when the temperature is 400° C. or above. In this respect, the temperature does not have an upper limit, but in view of restriction of the apparatus or reactivity, the temperature actually has an upper limit of about 800° C. The temperature is more preferably set in a range from 400° C. to 700° C., and even more preferably in a range from 400° C. to 650° C. Further, the pressure does not have an upper limit in the above respect, but in view of restriction of the apparatus or reactivity, the pressure actually has an upper limit of about 100 Torr (about 13333 Pa). The pressure is more preferably set in a range from 10 Torr to 30 Torr (about 1333 Pa to 4000 Pa). The other conditions will be described later.

When the formation of the tungsten film is completed in the step 1, an upper portion of the buried portion 204 is closed in a state where a void (seam) 205 is formed inside the buried portion 204 due to bowing or the like of the hole 203 (see FIG. 3A). Accordingly, in the present embodiment, after the film formation of the step 1, etching is performed in the same chamber by using the $WCl_6$ gas having an etching property, so that an opening 206 is formed at the upper portion of the buried portion 204 (step 2, see FIG. 3B). A desired temperature range at this time is the same as that in the step 1.

As described above, the $WCl_6$ gas has an etching property and thus is used for etching. At this time, the opening 206 is formed by the etching such that the void (seam) 205 can be filled by a next tungsten film forming process. The etching amount may be, e.g., about 1 nm to 20 nm.

In the etching, $WCl_6$ gas may be used together with $H_2$ gas as a reducing gas. In the case of using another gas as the reducing gas in the film forming process, the another gas may be used together with $WCl_6$ gas. By using the reducing gas, the etching can be controlled. At this time, a pressure and a gas flow rate are controlled such that the etching is more dominant than the film formation.

In the etching process, supply of $WCl_6$ gas may be performed at one time. However, in view of realization of controllable etching, a cycle of pressure increase→$WCl_6$ flow→evacuation purge may be repeated multiple times.

After the opening 206 is formed, a tungsten film is formed in the same chamber as used in the steps 1 and 2 after a process of purging the inside of the chamber 1 (step 3, see FIG. 3C). Accordingly, tungsten can be filled in the void (seam) 205 formed at the buried portion 204. In this manner, it possible to eliminate a void or a seam formed at the buried portion 204 without complicated processes.

The film forming conditions in the step 3 can be set to the same as those in the step 1.

The steps 1 to 3 are performed in the same chamber by using the $WCl_6$ gas substantially at the same temperature. Accordingly, a tungsten film can be simply formed with a high throughput without a void or a seam formed at a buried portion.

In the above-described method, the formation of the buried portion 204 in the step 1 may be carried out by performing a tungsten film forming process once. However, the buried portion 204 may not be well-shaped by performing the tungsten film forming process only once. When the shape of the buried portion 204 is poor, the void (seam) 205 may not be completely filled even by performing the etching in the step 2 and the film formation in the step 3. In this case, it is preferable to execute the step 1 of forming the buried portion 204 by performing at least twice the tungsten film forming process before and after the etching process. For example, it is preferable to execute the step 1 of forming the buried portion 204 by performing the tungsten film formation→the etching→the tungsten film formation (second film formation) or by performing the tungsten film formation→the etching→the tungsten film formation→the etching→the tungsten film formation (third film formation) and then execute the steps 2 and 3. As a consequence, the surface of the tungsten film is planarized and the buried portion 204 becomes well-shaped, which makes it possible to reliably eliminate a void or a seam by the steps 2 and 3. The etching at this time may be performed under the same conditions as those in the step 2.

Hereinafter, a specific sequence of the tungsten film formation in the steps 1 and 3 will be described.

(Film Formation Using CVD Method)

First, the film formation using a CVD method will be described.

Figure 4:
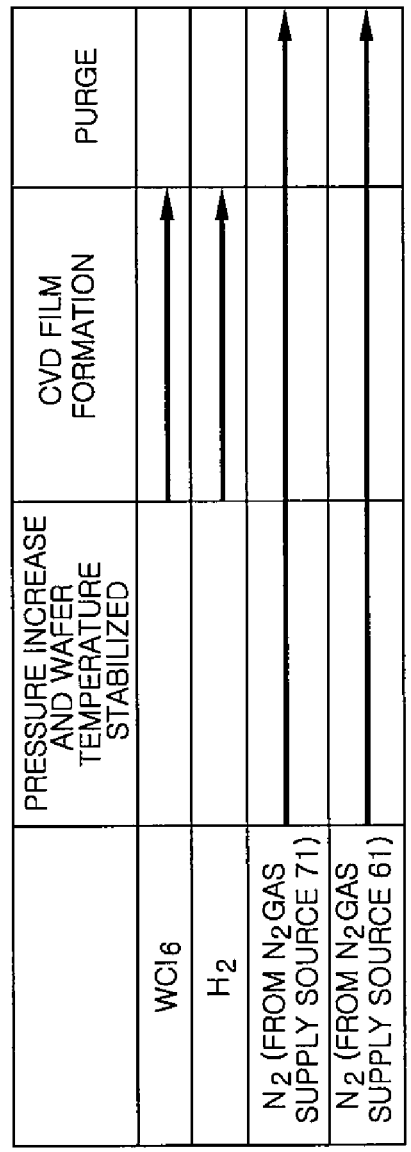
FIG. 4 shows a processing recipe for film formation using a CVD method.

FIG. 4 shows a processing recipe for the film formation using a CVD method. First, the valves 37, 37a, and 45 are closed and the valves 63 and 73 are made to open. Accordingly, $N_2$ gases are supplied from the $N_2$ gas supply sources 61 and 71 into the chamber 1 to increase a pressure in the chamber 1. A temperature of the wafer W on the susceptor 2 is stabilized.

After the pressure in the chamber 1 reaches a predetermined level, the valves 37 and 37a are opened in a state where the $N_2$ gases are supplied from the $N_2$ gas supply sources 61 and 71, so that $N_2$ gas serving as a carrier gas is supplied into the film forming material tank 31 to carry $WCl_6$ gas sublimated in the film forming material tank 31 into the chamber 1. $H_2$ gas is also supplied from the $H_2$ gas supply source 42 into the chamber 1 by opening the valve 45. Then, the reaction between the $WCl_6$ gas as a tungsten source gas and the $H_2$ gas as a reducing gas occurs, thereby forming a tungsten film.

The film forming process is continuously preformed until the thickness of the tungsten film reaches a predetermined level. Thereafter, the valve 45 is closed to stop the supply of $H_2$ gas, and $N_2$ gas as a purge gas is supplied into the chamber 1 to purge the inside of the chamber 1. In this manner, the film formation using a CVD is completed. A thickness of the tungsten film can be controlled by controlling a period of time for film formation.

(Film Formation Using ALD Method)

Hereinafter, the film formation using an ALD method will be described.

Figure 5:
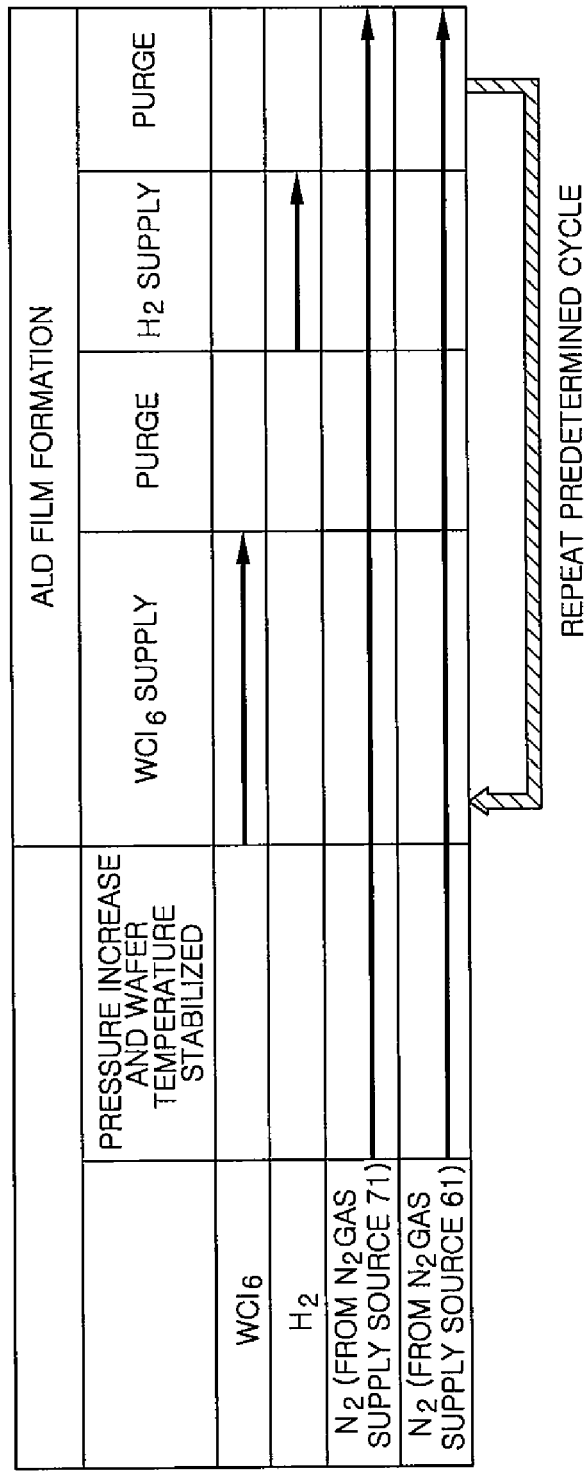
FIG. 5 shows a processing recipe for film formation using an ALD method.

FIG. 5 shows a processing recipe for the film formation using an ALD method. As in the case of employing the CVD method, first, the valves 37, 37a, and 45 are closed and the valves 63 and 73 are made to open. Accordingly, $N_2$ gases are supplied from the $N_2$ gas supply sources 61 and 71 into the chamber 1 to increase a pressure in the chamber 1. A temperature of the wafer W on the susceptor 2 is stabilized.

After the pressure in the chamber 1 reaches a predetermined level, the valves 37 and 37a are opened in a state where the $N_2$ gases are supplied from the $N_2$ gas supply sources 61 and 71, so that $N_2$ gas as a carrier gas is supplied into the film forming material tank 31 to carry $WCl_6$ gas sublimated in the film forming material tank 31 into the chamber 1 in a short period of time. The $WCl_6$ gas is adsorbed on the surface of the wafer W ($WCl_6$ gas supply step). Thereafter, the valves 37 and 37a are closed to stop the supply of the $WCl_6$ gas and thus only the $N_2$ gas as a purge gas is supplied into the chamber 1, so that a residual $WCl_6$ gas in the chamber 1 is purged (purge step).

Next, $H_2$ gas is supplied from the $H_2$ gas supply source 42 into the chamber 1 in a short period of time by opening the valve 45 in a state where the $N_2$ gases are supplied from the $N_2$ gas supply sources 61 and 71. The supplied $H_2$ gas reacts with $WCl_6$ adsorbed on the surface of the wafer W ($H_2$ gas supply step). Next, the valve 45 is closed to stop the supply of the $H_2$ gas and thus only the $N_2$ gas as a purge gas is supplied into the chamber 1, so that a residual $H_2$ gas in the chamber 1 is purged (purge step).

A thin tungsten unit film is formed by performing one cycle of the $WCl_6$ gas supply step, the purge step, the $H_2$ gas supply step, and the purge step. By repeating the cycle multiple times, a tungsten film having a desired thickness is formed. A thickness of the tungsten film can be controlled by the repetition number of the cycle.

In the steps 1 and 3, the conditions other than the temperature and the pressure are preferably set as follows.

CVD Method
$N_2$ carrier gas flow rate: 20 to 500 sccm (mL/min)
($WCl_6$ gas supply amount: 0.25 to 15 sccm (mL/min))
$H_2$ gas flow rate: 500 to 5000 sccm (mL/min)
Heating temperature of the film forming material tank: 130° C. to 170° C.

ALD Method
$N_2$ carrier gas flow rate: 20 to 500 sccm (mL/min)
($WCl_6$ gas supply amount: 0.25 to 15 sccm (mL/min))
$WCl_6$ gas supply time (per once): 0.5 to 10 sec
$H_2$ gas flow rate: 500 to 5000 sccm (mL/min)
$H_2$ gas supply time (per once): 0.5 to 10 sec
Heating temperature of the film forming material tank: 130° C. to 170° C.

In the case of performing the etching of the step 2, as in the case of forming a tungsten film in the step 1 and the step 3, first, the valves 37, 37a, and 45 are closed and the valves 63 and 73 are made to open. Accordingly, $N_2$ gases are supplied from the $N_2$ gas supply sources 61 and 71 into the chamber 1 and a pressure in the chamber 1 is increased. A temperature of the wafer W on the susceptor 2 is stabilized.

After the pressure in the chamber 1 reaches a predetermined level, the valves 37 and 37a are opened in a state where the $N_2$ gases are supplied from the $N_2$ gas supply sources 61 and 71, so that $N_2$ gas as a carrier gas is supplied into the film forming material tank 31. $WCl_6$ gas sublimated in the film forming material tank 31 is supplied at a predetermined flow rate into the chamber 1 and the etching is performed. At this time, $H_2$ gas may be supplied from the $H_2$ gas supply source 42 at a predetermined flow rate into the chamber 1 by opening the valve 45.

In the step 2, the conditions are preferably set as follows.
Pressure in chamber: 1 to 30 Torr (133 to 4000 Pa)
$N_2$ carrier gas flow rate: 50 to 500 sccm (mL/min)
($WCl_6$ gas supply amount: 1 to 10 sccm (mL/min))
$H_2$ gas flow rate: 0 sccm (mL/min)
Heating temperature of the film forming material tank: 130° C. to 170° C.

In the method of the present embodiment, a buried portion is formed by filling a tungsten film in a hole that is a recess by using a CVD or an ALD method using a $WCl_6$ gas. Then, an opening is formed by etching an upper portion of the buried portion by using the etching property of the $WCl_6$ gas used for the film formation. Next, a tungsten film is formed in the buried portion by the CVD method or the ALD method using the $WCl_6$ gas. Since the above three processes are performed by using the $WCl_6$ gas in the same chamber, the processing can be simply performed substantially at the same temperature. Accordingly, tungsten can be simply buried with a high throughput without generating a void or a seam at the hole having a high aspect ratio. Further, since $WCl_6$ that does not contain fluorine is used as a tungsten source, the base is hardly damaged even when the barrier film becomes thin by the miniaturization. Moreover, the gas used for the etching is the same as the gas used for the film formation, so that it is unnecessary to switch gas of a gas delivery line.

<Film Forming Method of Second Embodiment>

Figure 6:
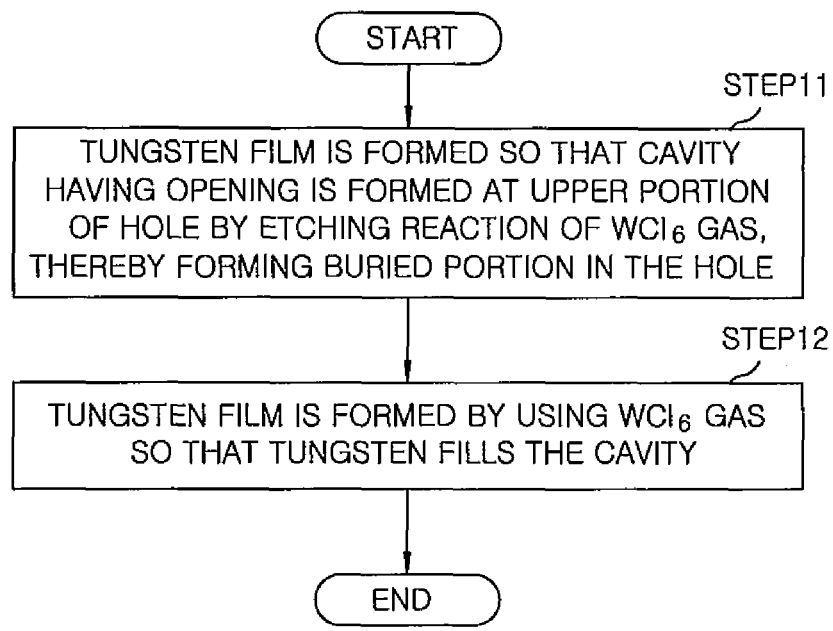
FIG. 6 is a flowchart of the film forming method in accordance with a second embodiment of the present invention.
Figure 7A:
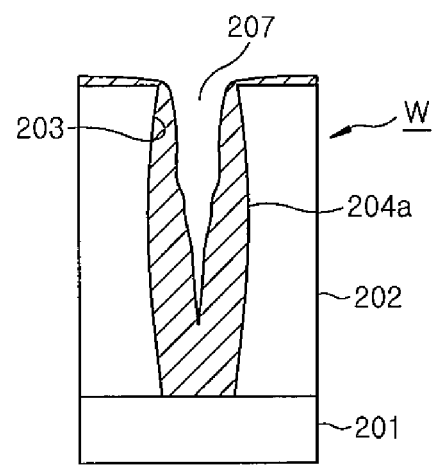
FIGS. 7A and 7B are cross sectional views showing processes of the film forming method in accordance with the second embodiment of the present invention.
Figure 7B:
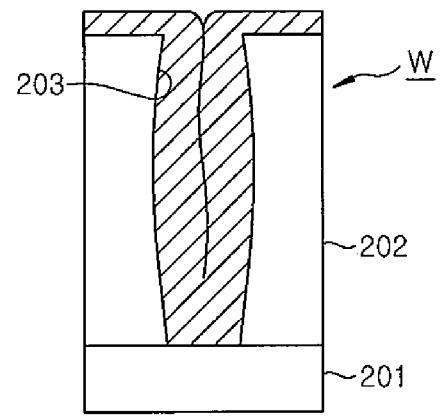

A film forming method in accordance with a second embodiment of the present invention which is performed by the film forming apparatus 100 configured as described above will be described. FIG. 6 is a flowchart of the film forming method in accordance with the second embodiment of the present invention. FIGS. 7A and 7B are cross sectional views showing processes of the film forming method.

In the first embodiment, the tungsten film is formed in three steps, i.e., the steps 1 to 3. However, in the second embodiment, the tungsten film is formed in two steps.

Specifically, first, the film forming conditions are adjusted so that a cavity 207 having an opening is formed at an upper portion of the hole 203 by an etching reaction of $WCl_6$ gas which is a tungsten source. In this condition, a buried portion 204a is formed in the hole 203 by forming a tungsten film (step 11, see FIG. 7A).

After the buried portion 204a is formed, a tungsten film is formed substantially at the same temperature in the same chamber as that used in the step 11 so that tungsten fills the cavity 207 after a process of purging the inside of the chamber 1 (step 12, see FIG. 7B).

In the step 11, $WCl_6$ gas and $H_2$ gas as a reducing gas are used, as in the step 1 of the first embodiment. However, the film formation in the step 11 is performed under the conditions in which the etching is more dominant than the film formation compared to those in the step 1. Specifically, for example, a flow rate of $WCl_6$ gas is set to be high by setting a flow rate of $N_2$ carrier gas used for supplying $WCl_6$ gas to 300 to 500 sccm (mL/min), or a flow rate of $H_2$ reducing gas is set to be as low as 500 sccm to 1500 sccm (mL/min). By doing so, the hole 203 can be filled such that the cavity 207 is formed without generating an overhang portion at the upper portion of the hole 203.

In this state, the cavity 207 is filled by forming a tungsten film under the conditions that ensure excellent buriability in the step 12. The conditions at this time may be the same as those in the steps 1 and 3.

In the second embodiment, a tungsten film can be more simply formed with a higher throughput, compared to the first embodiment, without generating a void or a seam at the buried portion.

<Other Application>

While the embodiments of the present invention have been described, the present invention may be variously modified without being limited to the above embodiments. For example, although the above embodiments have described the case of filling tungsten in a hole by forming a tungsten film, the present invention may also be applied to the case of filling tungsten in a recess such as a trench or the like, other than a hole.

In the above embodiments, the semiconductor wafer has been described as a substrate to be processed. However, the semiconductor wafer may be a silicon substrate or a compound semiconductor such as GaAs, SiC, GaN and the like. Further, the present invention may be applied to a glass substrate for use in FPD (flat-panel display) such as a liquid crystal display and the like, a ceramic substrate or the like without being limited to a semiconductor wafer.

While the invention has been shown and described with respect to the embodiments, it will be understood by those skilled in the art that various changes and modifications may be made without departing from the scope of the invention as defined in the following claims.

What is claimed is:

1. A tungsten film forming method comprising:
providing a substrate having a recess in a processing chamber;
forming a first tungsten film on the substrate to fill the recess with a tungsten by simultaneously or alternately supplying $WCl_6$ gas as a tungsten source and a reducing gas under a depressurized atmosphere of the processing chamber, and by reacting the $WCl_6$ gas with the reducing gas while heating the substrate;
forming an opening in the tungsten filled in the recess by supplying $WCl_6$ gas into the processing chamber and etching an upper portion of the tungsten without using a plasma; and
forming a second tungsten film on the substrate having the opening by simultaneously or alternately supplying the $WCl_6$ gas and the reducing gas into the processing chamber, and by reacting the $WCl_6$ gas with the reducing gas while heating the substrate.

2. The tungsten film forming method of claim 1, wherein in said forming the opening, the reducing gas is further supplied into the processing chamber.

3. The tungsten film forming method of claim 1, wherein the reducing gas includes $H_2$ gas.

4. The tungsten film forming method of claim 1, wherein during said forming the first tungsten film, said forming the opening and said forming the second tungsten film, a temperature of the substrate is maintained at about 400° C. or higher.

5. The tungsten film forming method of claim 4, wherein said forming the first tungsten film, and said forming the second tungsten film are performed in a state where a pressure in the processing chamber is set to about 10 Torr or higher.

6. A non-transitory computer-executable storage medium including computer executable instructions, when executed by a processor, causing the processor to perform the tungsten film forming method described in claim 1.

7. A tungsten film forming method comprising:
providing a substrate having a recess in a processing chamber;
forming a first tungsten film on the substrate to fill the recess with a tungsten of the first tungsten film by simultaneously or alternately supplying $WCl_6$ gas as a tungsten source and a reducing gas under a depressurized atmosphere of the processing chamber, and by reacting the $WCl_6$ gas with the reducing gas while heating the substrate so that a cavity having an opening is formed at an upper portion of the tungsten filled in the recess by an etching reaction of the $WCl_6$ gas without using a plasma; and
forming a second tungsten film on the substrate having the tungsten filled in the recess by simultaneously or alternately supplying the $WCl_6$ gas and the reducing gas into the processing chamber, and by reacting the $WCl_6$ gas with the reducing gas while heating the substrate so that the cavity is filled with a tungsten of the second tungsten film.

8. The tungsten film forming method of claim 7, wherein the reducing gas includes $H_2$ gas.

9. The tungsten film forming method of claim 7, wherein during said forming the first tungsten film and said forming the second tungsten film, a temperature of the substrate is maintained at about 400° C. or higher.

10. A non-transitory computer-executable storage medium including computer executable instructions, when executed by a processor, causing the processor to perform the tungsten film forming method described in claim 7.

* * * * *